United States Patent
Yasuda et al.

(10) Patent No.: US 6,469,327 B1
(45) Date of Patent: Oct. 22, 2002

(54) SEMICONDUCTOR DEVICE WITH EFFICIENTLY ARRANGED PADS

(75) Inventors: Kenichi Yasuda; Hideto Hidaka; Mikio Asakura; Tsukasa Ooishi; Kei Hamade, all of Hyogo (JP)

(73) Assignee: Mitsubshi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/900,515

(22) Filed: Jul. 25, 1997

Related U.S. Application Data (63) Continuation of application No. 08/637,910, filed on Apr. 25, 1996.

(30) Foreign Application Priority Data

Nov. 28, 1995 (JP) ................................................ 7-308865

(51) Int. Cl.$^7$ ............................................... H01L 27/10
(52) U.S. Cl. ....................................... 257/207; 257/208
(58) Field of Search .............................. 257/207, 208, 257/326, 666, 668, 690; 326/37, 38, 39, 41, 47

(56) References Cited

U.S. PATENT DOCUMENTS

| | | | | |
|---|---|---|---|---|
| 5,250,840 A | * | 10/1993 | Oh et al. | 257/666 |
| 5,299,160 A | * | 3/1994 | Mori | 365/200 |
| 5,347,150 A | * | 9/1994 | Sakai et al. | 259/203 |
| 5,410,671 A | * | 4/1995 | Elgamal et al. | 395/425 |
| 5,432,467 A | * | 7/1995 | Reddy | 326/81 |

FOREIGN PATENT DOCUMENTS

| | | |
|---|---|---|
| JP | 5-343526 | 12/1993 |
| KR | 96-43145 | 12/1996 |

OTHER PUBLICATIONS

C. Harper "Electronic Packaging And Interconnect Handbook", McGraw Hill, pp. 6.17, 11.23, 1991.*

* cited by examiner

*Primary Examiner*—Douglas A. Wille
(74) *Attorney, Agent, or Firm*—McDermott, Will & Emery (57) ABSTRACT

Pads are alignedly arranged in a central region of a semiconductor chip and are also arranged at an outer peripheral portion of the central portion of the chip. A pad at the outer peripheral portion is electrically connected to a die pad mounting the chip thereon with an insulative material interposed therebetween. A potential supplied to the pad positioned at the outer peripheral portion can be stabilized by parasitic capacitance of the die pad, and a potential of the die pad can be externally monitored easily by removing away a portion of mold resin after resin sealing. Further, due to a cress shaped arrangement of the pads, a voltage down converter can be arranged in line with the pads and at outer periphery of the chip without area penalty. In testing operation, a switching circuit switches a function of a pad to another pad so that cross-shapedly arranged pads are equivalently arranged in a line.

19 Claims, 8 Drawing Sheets

50: COMPRESSING CIRCUIT

VDC

SEMICONDUCTOR DEVICE WITH EFFICIENTLY ARRANGED PADS

This application is a continuation of application Ser. No. 08/637,910 filed Apr. 25, 1996.

BACKGROUND OF THE INVENTION

1. Field of the Invention

The present invention relates to a semiconductor device and particularly to efficient arrangement of pads on a semiconductor chip. More specifically, it relates to a configuration implementing testability and stable supply of an internal power-supply potential while employing such pad arrangement.

2. Description of the Background Art

Figure 15:
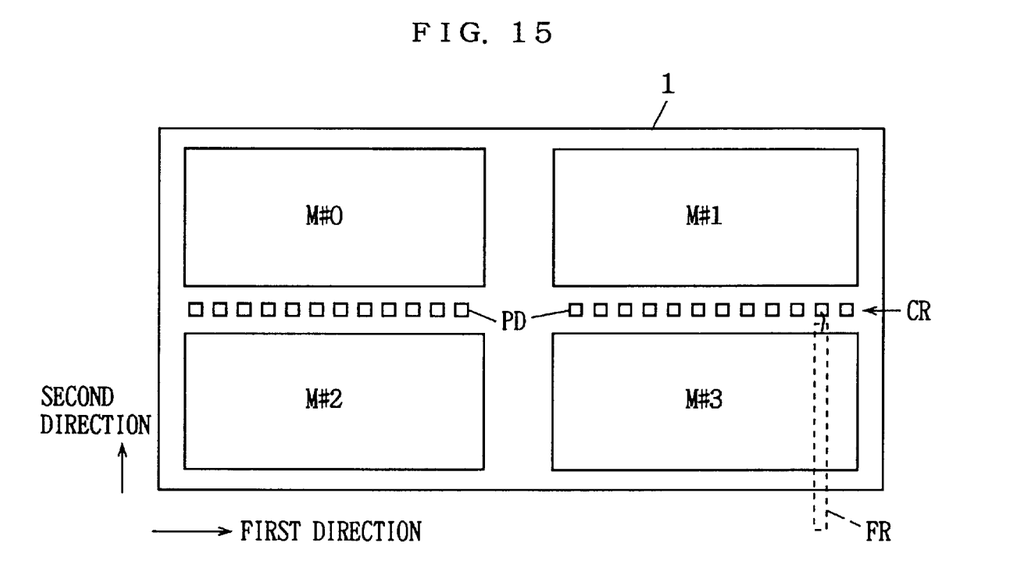
FIG. 15 shows a pad arrangement of a conventional semiconductor device.

FIG. 15 schematically shows a chip layout of a semiconductor device having a conventional pad arrangement suitable for a LOC (Lead on Chip) structure. In FIG. 15, pads PD are alignedly arranged on a central region CR with respect to a second direction (referred to as "the shorter side direction" hereinafter), extending in a first direction (referred to as "the longer side direction" hereinafter) of a semiconductor chip 1. Arranged at each side of central region CR of semiconductor chip 1 are internal circuits M#0–M#3 which, for example, are memory cell arrays. Pad PD is connected through a bonding wire to a lead frame FR extending over the semiconductor chip to the central portion near central region CR.

With this LOC structure, it is possible to alignedly arrange the pads PD in a line in central region CR. Therefore, compared with the configuration in which the pads are arranged at both end portions in the shorter side direction, the pad occupying area can be reduced and accordingly, the chip area can be reduced. Furthermore, since the pads, serving as interface of signals and voltages (power-supply potential and ground potential), are arranged in central region CR, the length of a interconnection line such as a signal line and a power-supply line to internal circuits M#0–M#3 can be reduced, signal propagation delay can be reduced and interconnection layout is relatively facilitated. Also, since pads PD are alignedly arranged in a line, probes for testing the semiconductor device can be alignedly arranged in a line and according to the pitch of pads PD in a wafer test. Accordingly, a number of probes can be arranged in parallel in the measuring jig and the number of semiconductor devices (chips) which can simultaneously be observed can be increased.

In the recent semiconductor devices, particularly, in the semiconductor memory device, the number of input/output data bits has been increased to 16 bits, 32 bits, and so on and the number of input/output data pads is accordingly increased. Furthermore, with the multi-functionalization of semiconductor devices, a variety of tests have to be performed a number of times to ensure reliability of the semiconductor devices, and a monitor pad for outputting externally a signal indicating an internal state when the tests are performed is required. Since the number of pads which can be arranged in central region CR is determined by the longer side length of semiconductor chip 1, it is difficult to alignedly arrange all of a number of pads in a line in central region CR without increasing the longer side length of the chip.

Furthermore, in a integrated semiconductor memory device, the operating power-supply potential is lowered to reduce power to be consumed and to enable high-speed operation. On the other hand, a device such as CPU (Central Processing Unit) serving as an external device has a smaller integration degree as compared with the semiconductor memory device and its operating power-supply potential cannot be lowered to that of the semiconductor memory device. Therefore, in the semiconductor memory device, an externally applied potential is internally down-converted to produce a lower power-supply potential in order to maintain its compatibility with an external device and a past-generation semiconductor memory device (a semiconductor memory device with a higher power-supply potential).

Figure 16:
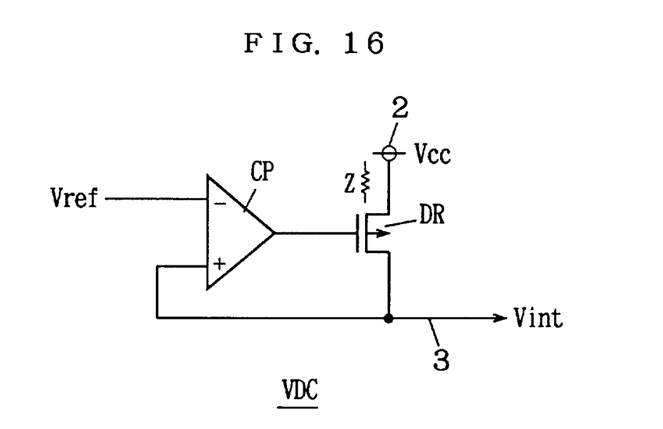
FIG. 16 schematically shows a configuration of a conventional internal voltage-down converter.

FIG. 16 schematically shows the configuration of a conventional internal voltage-down converter used in a semiconductor memory device. In FIG. 16, an internal voltage-down converter VDC includes: a drive transistor DR which is connected between a node 2 supplying an external power-supply potential Vcc and an internal power-supply line 3 and is configured by a p channel MOS transistor (an insulated gate type field effect transistor); and a comparison circuit CP which compares a reference potential Vref with an internal power supply potential Vint to control the conductance of drive transistor DR according to the result of the comparison. Comparison circuit CP outputs a high level signal to turn off drive transistor DR when internal power supply potential Vint is higher than reference potential Vref. Reversely, comparison circuit CP outputs a low level signal to increase the conductance of drive transistor DR when internal power supply potential Vint is lower than reference potential Vref. Drive transistor DR supplies current from external power supply node 2 to internal power supply line 3 according to an output signal of comparison circuit CP. Thus, internal power supply potential Vint is maintained at the potential level of reference potential Vref. When an internal circuit operates and consumes internal power supply potential Vint, drive transistor DR supplies a large current from external power supply node 2 to internal power supply line 3 to compensate for the decrease in internal power supply potential Vint.

When such a large current flows, a substrate current can flow from an impurity region of drive transistor DR into the semiconductor substrate and minority carriers can be generated in the semiconductor substrate. When internal circuits M#0–M#3 shown in FIG. 15 are memory cell arrays, the minority carriers thus generated in the semiconductor substrate may destroy data of memory cells contained in the memory cell arrays and therefore, internal voltage-down converter VDC is preferably arranged as far from the memory cell arrays as possible. In the arrangement shown in FIG. 15, the farthest portion from such memory cell arrays is central region CR. However, as a number of pads PD are provided in central region CR, it is difficult to further arrange internal voltage-down converter VDC efficiently within central region CR.

Further, if external power supply node 2 is distant from drive transistor DR, that is, if an external power supply pad is distant from internal voltage-down converter VDC, impedance (indicated by the reference character Z) of the external power supply interconnection line is increased, change in current supplied by drive transistor DR is delayed from the change in internal power supply potential Vint on internal power supply line 3 and internal power supply potential Vint cannot be maintained accurately at the level of reference potential Vref. Furthermore, the increased impedance Z produces potential drop on the external power supply interconnection line (the interconnection line between node 2 and drive transistor DR), the conductance of drive transistor DR becomes higher than the designed value (drive transistor DR is a p channel MOS transistor and its conductance is determined by a potential difference between the source and the gate), a required current cannot be supplied onto internal power supply line 3, the potential drop of internal power supply potential Vint cannot be compensated for, and internal power supply potential Vint cannot be maintained at a constant level of reference potential Vref.

SUMMARY OF THE INVENTION

An object of the present invention is to provide a semiconductor device having an efficient arrangement of pads in which the number of pads can be easily increased without increasing chip size.

Another object of the present invention is to provide a semiconductor device allowing an internal potential generating circuit to be arranged without reducing the number of pads.

Still another object of the present invention is to provide a semiconductor device having an efficient arrangement of pads with which tests can be performed efficiently.

A semiconductor device according to a first aspect of the present invention includes: a plurality of power supply pads each receiving a power supply potential which in turn is externally applied; and an internal potential generating circuit disposed between the plurality of power supply pads and generating an internal potential from the power supply potential received from the power supply pads.

A semiconductor device according to a second aspect of the present invention includes: a power supply pad disposed at an end portion with respect to a first direction of a semiconductor chip, and receiving and supplying internally a power supply potential which is externally applied; and an internal voltage generating circuit disposed at an end portion with respect to the first direction of the semiconductor chip and receiving the power supply potential from the power supply pad to generate an internal voltage.

A semiconductor device according to a third aspect of the present invention includes: a conductive mounting member; a semiconductor substrate mounted on the mounting member with an insulative material placed therebetween, and having a component formed thereon; a predetermined potential generating portion formed on the semiconductor substrate; and means for electrically connecting the predetermined potential generating portion with the conductive mounting member.

A semiconductor device according to a fourth aspect of the present invention includes: a plurality of first pads alignedly arranged in a central region with respect to an X direction of a semiconductor substrate and arranged along a Y direction orthogonal to the X direction, each being assigned a predetermined function; a plurality of second pads alignedly arranged in a central region with respect to the Y direction of the semiconductor substrate and arranged along the X direction; and switching means responsive to an operation mode designating signal for assigning a function of at least one predetermined pad of the plurality of the first pads to a preselected pad of the plurality of the second pads.

By disposing the internal potential generating circuit between the plurality of power supply pads, the distance between the internal potential generating circuit and the power supply pads can be made shorter. Furthermore, since a power supply potential is supplied by the plurality of power supply pads, a power supply line is reinforced and a desired internal potential can be stably generated.

When the mounting member mounting a semiconductor chip thereon is electrically connected to the predetermined potential generating portion formed on the semiconductor substrate, a predetermined potential can be easily monitored even after mold sealing of the device, by nicking away a portion of the mold so that the mounting member can be exposed. Since the semiconductor substrate and the mounting member form a large capacitance capacitor, a stabilizing capacitance for the predetermined potential can be easily realized.

When the pads arranged in two directions orthogonal to each other are switched so that a function of a pad in one direction is assigned to a pad in the other direction according to an operation mode, the pads can be alignedly arranged in a line easily and thus the feature of the LOC structure that the number of testable chips can be increased, can be easily implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Principle Structure

Figure 1:
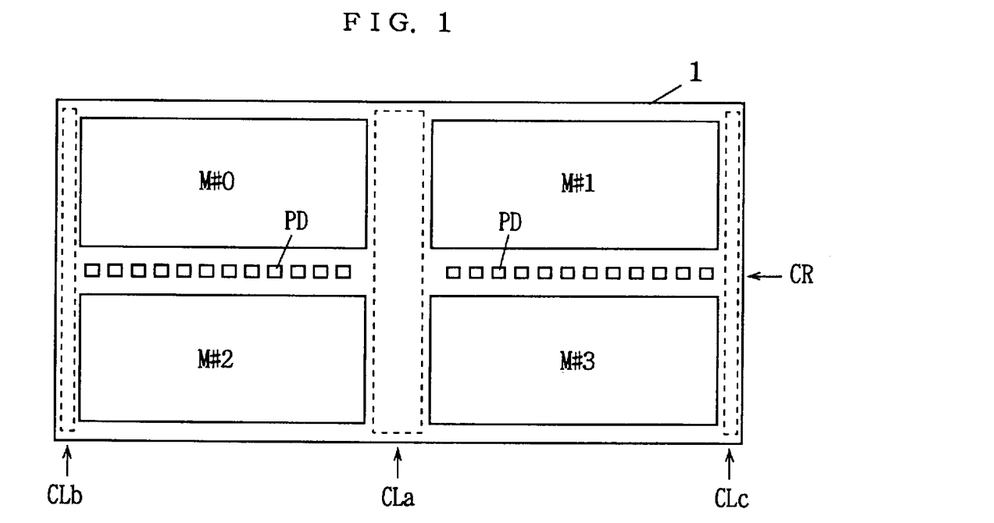
FIG. 1 shows the principle structure of the pad arrangement of a semiconductor device according to the present invention.

FIG. 1 shows the principle structure of pad arrangement of a semiconductor device according to the present invention. In FIG. 1, pads PD are arranged in a central region CR positioned at the central portion of the shorter side direction of a semiconductor chip 1 along the longer side direction. The configuration in which central region CR-is utilized as a pad arranging region is the same as that of LOC structure. In a semiconductor device of the present invention, a central region CLa positioned at a central portion of the longer side direction of semiconductor chip 1, and regions CLb, CLc positioned at each end portion of semiconductor chip 1 with respect to the longer side portion are also used as pad arranging regions. Thus, together with pads PD arranged in central region CR, arranging pads in regions CLa, CLb and CLc allows arrangement of a number of pads without increasing the size of semiconductor chip 1. The present invention employs this pad arrangement to efficiently implement pad arrangement with testability, arrangement of an internal potential generating circuit which stably generates an internal potential and arrangement of a monitor pad.

First Embodiment

Figure 2A:
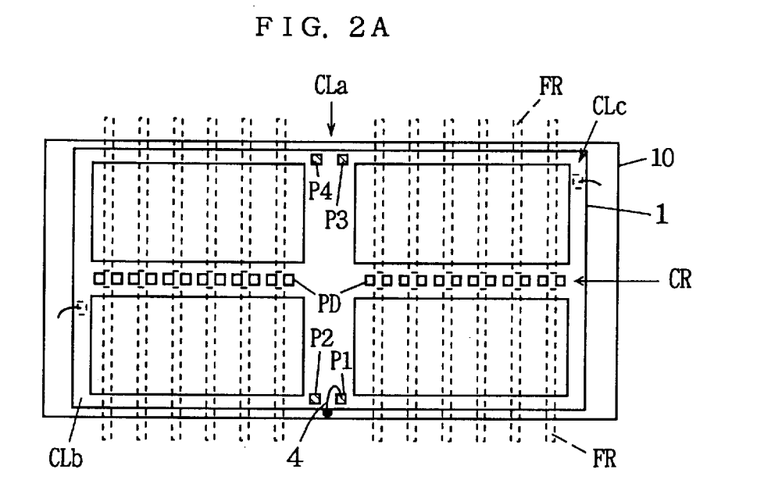
FIG. 2A is a planar arrangement of a semiconductor device according to a first embodiment of the present invention and FIG. 2B is a schematic front view thereof.
Figure 2B:
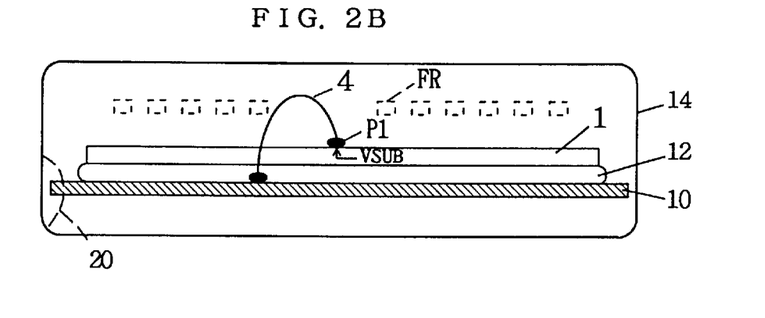

FIGS. 2A and 2B are a top view and a schematic front view, respectively, of a semiconductor device according to a first embodiment of the present invention. In FIG. 2A, in packaging, semiconductor chip 1 mounted on and supported by a conductive mounting base called a die pad. Die pad 10 is held by a lead frame which is not shown. After the packaging, die pad 10 is separated from the lead frame and so is a lead frame FR indicated by the broken lines in FIG. 2A. Pads PD are arranged in a line in central region CR of semiconductor chip 1 along the longer side direction of the chip. Arranged at one side of the outer periphery of central region CLa positioned at the central portion with respect to the longer side direction are pads P1 and P2, and arranged at the other side of the outer periphery are pads P3 and P4. Pad P1 is electrically connected to die pad 10 via a bonding wire 4. Pads P2–P4 are utilized as monitor pads for monitoring internal states in a test mode of operation. In packaging, lead frame FR is provided extending to the vicinity of pad PD arranged in central region CR. However, central region CLa does not have any undesirable influence on the portion for disposing lead frame FR. Therefore, pads P1–P4 can be easily arranged without affecting the arrangement of pads PD and required pads can be arranged. Pad P1 is coupled with a semiconductor substrate providing semiconductor chip 1 via a route described in detail later but not shown in the figures, and a substrate potential is transferred to pad P1.

In FIG. 2B, semiconductor chip 1 is placed on die pad 10 with a insulative material 12 interposed therebetween. As semiconductor chip 1 is simply disposed on the insulative material, processing of the back surface of semiconductor chip 1 is not required, a conductive material (e.g., gold or silver paste) is also not required and cost of the semiconductor device can be reduced, as compared with a conventional construction in which semiconductor chip 1 is electrically connected to die pad 10 using a conductive paste. Die pad 10, insulative material 12 and semiconductor chip 1 are sealed together with lead frame FR by mold resin 14. Lead frame FR externally extends from the mold resin to serve as an lexternal pin terminal.

Die pad 10 has a size made larger than that of semiconductor chip 1 in order to mount semiconductor chip 1 thereon. Therefore, a sufficiently large contact region which electrically connects bonding wire 4 to die pad 10 is obtained. This allows pad P1 formed on a surface of semiconductor chip 1 and die pad 10 to be electrically connected stably to each other. FIG. 2B shows as an example a structure in which a potential VSUB of a semiconductor substrate providing semiconductor chip 1 is first transferred to pad P1 and then, via bonding wire 4, to die pad 10. In this example, a portion of die pad 10 can be exposed external to mold resin 14 by removing a portion 20 of mold resin 14. By externally monitoring a potential of the exposed portion of die pad 10, the potential VSUB of the substrate as semiconductor chip 1 can be externally monitored easily. This allows one to easily estimate whether a desired potential level of the substrate potential is generated in the semiconductor device, without a negative influence to semiconductor chip 1. Furthermore, as the substrate providing semiconductor chip 1 is connected by pad P1 via bonding wire 4 to die pad 10, a large parasitic capacitance of die pad 10 can act as a stabilizing capacitance to stabilize substrate potential VSUB.

In the first embodiment above, substrate potential VSUB is transferred to die pad 10 via pad P1 and bonding wire 4. Pad P1 only has to be supplied with an internal potential required to be stabilized. Alternatively, pad P1 may receive a cell plate potential Vcp supplied to a cell plate of a memory cell capacitor of a DRAM (Dynamic Random Access Memory), or a bit line precharging potential VBL used for precharging a pair of bit lines having a column of DRAM cells connected therewith on standby. These potentials Vcp and VBL can be stabilized by the parasitic capacitance of die pad 10. Furthermore, removal of mold resin 14 allows potentials VBL and VCP can be externally monitored easily without providing an extra external pin terminal.

In FIG. 2A, pads connected with the die pad is provided at the outer periphery of central region CLa. However, pads to be connected with die pad 10 may be arranged in regions CLb and CLc positioned at either side of the longer side direction, as shown by the dotted line. In this example, semiconductor chip 1 and die pad 10 can be electrically connected to each other without any negative influence to lead frame FR arrangement.

Modification

Figure 3:
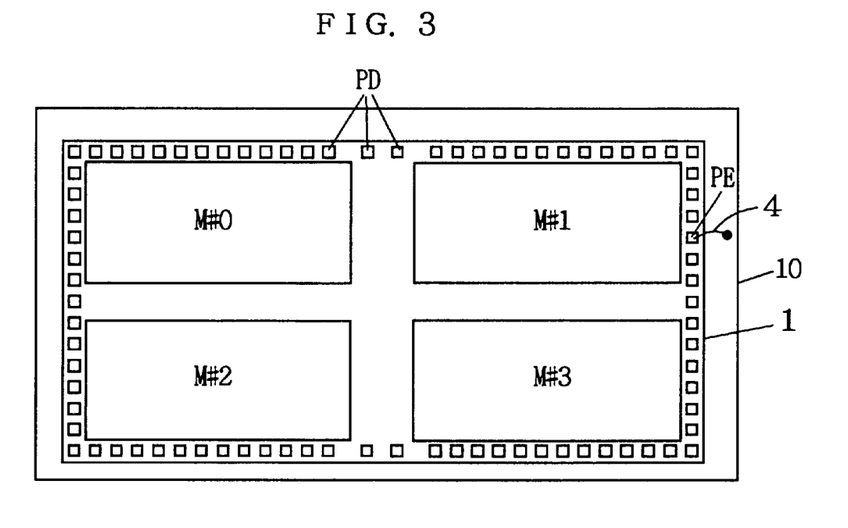
FIG. 3 is a planar layout of a modified semiconductor device for the first embodiment of the present invention.

FIG. 3 schematically shows the structure of a modification of the first embodiment of the present invention. In FIG. 3, pad PD are arranged along the outer periphery of semiconductor chip 1. An unused empty pad PE of pads PD is electrically connected to die pad 10 via bonding wire 4. By electrically connecting empty pad PE to the semiconductor substrate or to a predetermined potential generating portion by an internal interconnection line, a desired potential can be transferred to die pad 10. Similar to the construction shown in FIG. 2, an insulative material is disposed between die pad 10 and semiconductor chip 1. In such a configuration where the pads are peripherally arranged, the use of empty pad PE allows a desired potential to be externally monitored easily by removing a portion of resin, either, even after resin sealing.

Thus, according to the first embodiment, as a predetermined potential is transferred to a pad formed on semiconductor chip 1 and the pad receiving the predetermined potential is electrically connected to a die pad having the semiconductor chip mounted thereon, a desired potential can be easily transferred to the die pad and can be externally monitored easily without any negative influence to the pad arrangement required, and also the predetermined potential can be stabilized by a parasitic capacitance of the die pad.

Second Embodiment

Figure 4:
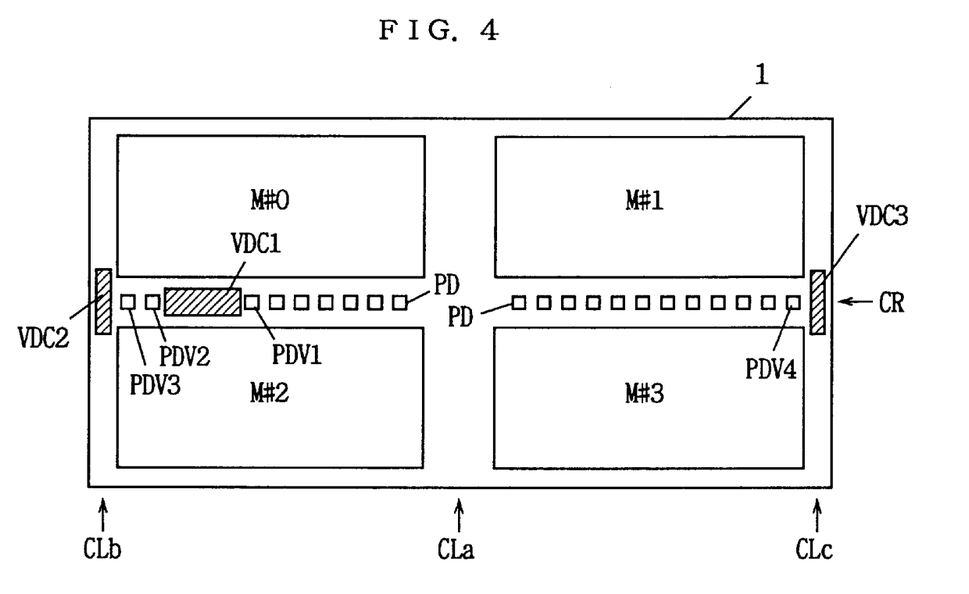
FIG. 4 is a planar layout of a semiconductor device according to a second embodiment of the present invention.

FIG. 4 schematically shows the chip layout of a semiconductor device according to a second embodiment of the present invention. In FIG. 4, power supply pads PDV1 and PDV2 are alignedly arranged in central region CR between internal circuit regions M#0 and M#2 of semiconductor chip 1. Disposed between power supply pads PDV1 and PDV2 is an internal voltage-down converter VDC1. Power supply pads PDV1 and PDV2 are externally supplied with power supply potential Vcc. Power supply pads PDV3 and PDV4 are arranged at respective ends of the outer peripheral portion in the longer side direction of central region CR. An internal voltage-down converter VDC2 is arranged in region CLb, adjacent to power supply pad VDC3, and an internal voltage-down converter VDC3 is arranged in region CLc, adjacent to power supply pad PDV4. The distance between power supply pad PDV3 and internal voltage down converter VDC2 is sufficiently shortened, and the distance between internal voltage down converter VDC1 and power supply pad PDV1 and the distance between linternal voltage down converter VDC1 and power supply pad PDV2 are sufficiently shortened. Similarly, the distance between power supply pad PDV4 and internal voltage down converter VDC3 is sufficiently shortened. Thus, the distances between the power supply pads and the internal voltage down converters are sufficiently shortened, power supply line providing area is reduced and an area occupied with interconnection lines is reduced. Furthermore, since a power supply line is shortened, the impedance of the power supply line is reduced and accordingly, the internal voltage down converters can be stably operated.

Figure 5A:
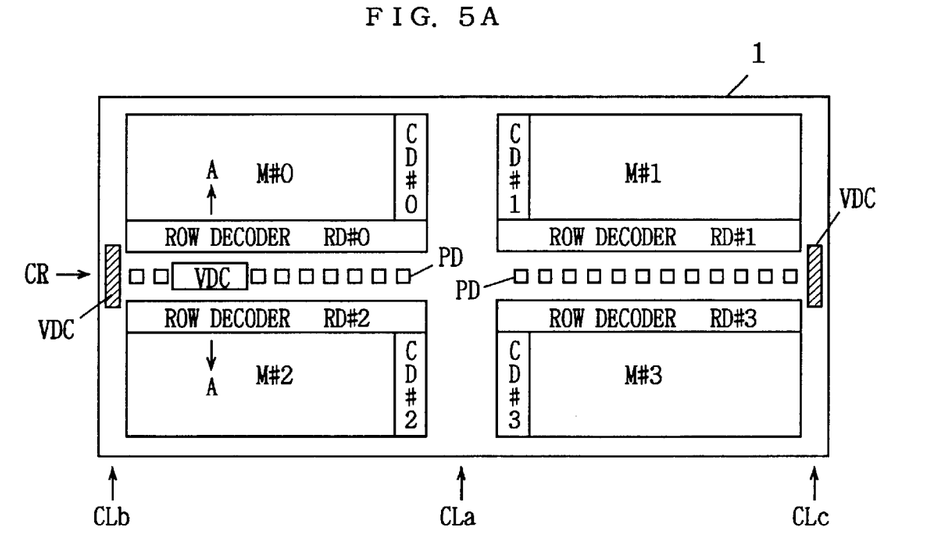
FIGS. 5A and 5B illustrate an effect of the layout shown in FIG. 4.
Figure 5B:
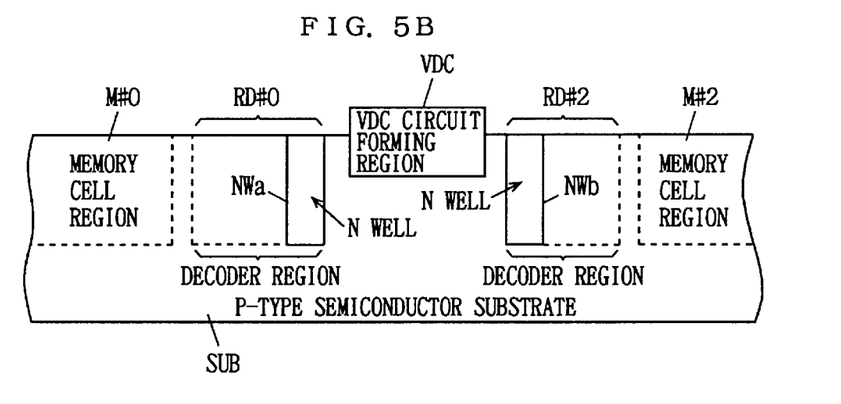

FIGS. 5A and 5B illustrate an effect of the second embodiment of the present invention. FIG. 5A shows the chip layout of the semiconductor device and FIG. 5B schematically shows the cross sectional structure taken along the line A—A of FIG. 5A. Figs. 5A and 5B show a structure in which the semiconductor device is a semiconductor memory device and internal circuits M#0–M#3 are memory cell arrays.

In FIG. 5A, row decoders RD#0–RD#3 and column decoders CD#0–CD#3 are arranged for memory cell arrays (internal circuits) M#0–M#3 formed on semiconductor chip 1, respectively. Row decoders RD#0–RD#3 are arranged for the corresponding memory cell arrays M#0–M#3, respectively, facing to central region CR and along the longer side direction. Column decoders CD#0–CD#3 are arranged for the corresponding memory cell arrays M#0–M#3, facing central region CLa and extending in the shorter side direction. When row decoders RD#0–RD#3 are activated, they put one row of memory cells in a selected state in the corresponding memory cell arrays M#0–M#3.

When column decoders CD#0–CD#3 are activated, they put one column (or a multiple of columns) of memory cells in the selected state in the corresponding memory cell arrays M#0–M#3. The arrangement of a word line put in the selected state by row decoders RD#0–RD#3 and the arrangement of the memory cell column(s) put in the selected state by column decoders CD#0–CD#3 (in memory cell arrays M#0–M#3, respectively) are determined depending on the structure of the semiconductor memory device. Internal voltage down converter VDC is formed in central region CR between memory cell arrays M#0 and M#2. Row decoders RD#0 and RD#2 as peripheral circuitry are disposed between internal voltage-down converter VDC and memory cell array M#0 and between internal voltage down converter VDC and memory cell array M#2.

As shown in FIG. 5B, the semiconductor memory device is formed on a p type semiconductor substrate SUB. Decoder regions for forming row decoders RD#0 and RD#2 are arranged at both sides of an internal voltage down converter (VDC circuit) forming region (indicated by the reference character VDC). Row decoders RD#0 and RD#2 each include a unit decode circuit constructed by a CMOS gate. That is, p channel MOS transistors are formed in the decoder regions (indicated by the reference characters RD#0 and RD#2). Semiconductor substrate SUB is a p type substrate and therefore, an N well which is an n type impurity region needs to be formed in order to form the p channel MOS transistors. FIG. 5B functionally shows an N well NWa of decoder region RD#0 and an N well NWb of decoder region RD#2. The p channel MOS transistors are formed within N wells NWa and NWb. In FIG. 5B, N wells NWa and NWb are shown functioning as buried isolating regions for internal voltage down converter (VDC circuit) forming region VDC. This is simply to represent the function of the N wells for the formation of the p channel MOS transistors formed in decoder regions RD#0 and RD#2. N wells NWa and NWb separate VDC circuit forming region VDC from regions in which memory cells of memory cell arrays M#0 and M#2 are formed.

A p channel MOS transistor generally has its substrate region (N well) biased to a constant potential (in order to prevent a formed biasing of the junction between the source/drain regions and the substrate region (N well)). N wells NWa and NWb are biased to a power supply potential level, for example. Therefore, when internal voltage-down converter VDC operates and even a substrate current is generated, the substrate current is absorbed by N wells NWa and NWb and does not reach memory regions M#0 and M#2. Thus, by forming internal voltage down converter VDC in central regions CR, it is ensured that the substrate current generated when internal voltage down converter VDC operates is prevented from affecting data of memory cells contained in memory cell arrays M#0 and M#2.

Even when internal voltage down converters VDC are formed in regions CLd and CLc positioned at both ends of central region CR, minority carriers (electrons) generated in p type semiconductor substrate SUB are similarly absorbed by N wells, since row decoders RD#0–RD#3 exist between memory cell arrays M#0–M#3 and internal voltage down converters VDC. Accordingly, it is ensured that the substrate current (electrons) generated when internal voltage down converters VDC operate is prevented from affecting data of memory cells contained in memory cell arrays M#0–M#3.

Figure 6:
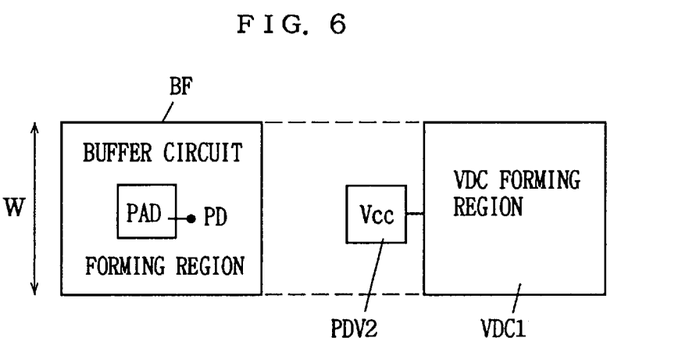
FIG. 6 schematically shows the structure of the pad portion shown in FIG. 4.

FIG. 6 shows an arrangement of the internal voltage down converter and pads shown in FIG. 4. In FIG. 6, a buffer circuit forming region BF applying and receiving signals to and from pad PD is arranged such that it surrounds pad PD. How a buffer circuit is arranged within buffer circuit forming region BF is determined by the type of the semiconductor device to which the present invention is applied. In central region CR, a pad portion consisting of pad PD and buffer circuit forming region BF disposed at its periphery is alignedly arranged in the longer side direction. Therefore, power-supply pad PDV2 and internal voltage down converter (VDC) forming region VDC1 arranged adjacent to power supply pad PDV2 have the same width W as buffer circuit forming region BF, and internal voltage down converter forming region VDC1 can be arranged in alignment with the pad portion (buffer circuit forming region BF) without a negative effect on the alignment of the pad portions in central region CR. Central region CR is separated from memory cell arrays contained in internal circuits M#0–M#3. Array peripheral circuitry, decoders and others are disposed between central region CR and memory cell arrays, the distance is made sufficiently long and N wells also exist. Thus, an arrangement of an internal voltage down converter without a negative effect on data of memory cell arrays can be implemented.

In the configuration shown in FIG. 4, three internal voltage down converters VDC1, VDC2 and VDC3 are provided. However, these internal voltage down converters may be provided as required, and only internal voltage down converter VDC1 may be provided or only internal voltage down converters VDC2 and VDC3 may be provided. By arranging power supply pads at end portions of the outer periphery of central region CR, internal voltage down converters VDC2 and VDC3 can be easily arranged. Also, by arranging internal voltage down converter VDC1 between power supply pads PDV1 and PDV2, internal voltage down converter VDC1 can be disposed without any negative influence to the alignment of pad portions. Furthermore, since power supply pads PDV1 and PDV2 are provided at both sides of internal voltage down converter VDC1, power supply lines from the two power supply pads PDV1 and PDV2 can be provided to supply an external power supply potential to internal voltage down converter VDC1, a power supply line for internal voltage down converter VDC1 can be reinforced (the external power supply potential can be stably supplied), and internal voltage down converter VDC1 can be stably operated. Power supply pads PDV1 and PDV2 may be adapted to supply a power supply potential to another circuit portion and so may power supply pads PDV3 and PDV4.

Modification

Figure 7:
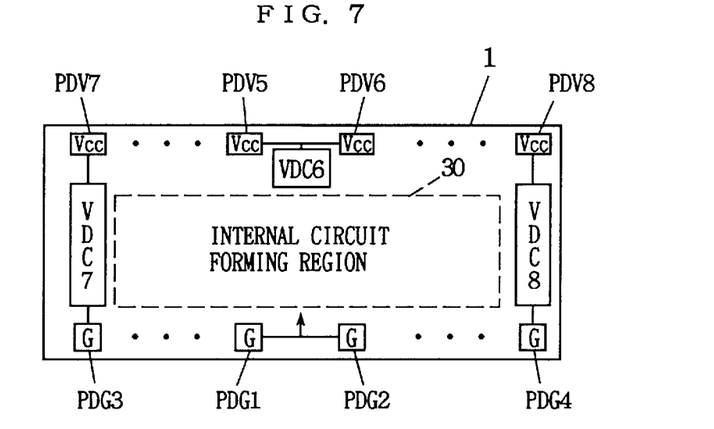
FIG. 7 schematically shows the structure of a modification of the second embodiment of the present invention.

FIG. 7 shows the configuration of a modification of the second embodiment of the present invention. In FIG. 7, the pads are arranged at the outside of an internal circuit forming region 30 of semiconductor chip 1 along the outer periphery of semiconductor chip 1. Power supply pads PDV7 and PDV8 are arranged on one side of the outer periphery of semiconductor chip 1 at respective ends in the longer side direction thereof, and power supply pads PDV5 and PDV6 are arranged between pads PDV7 and PDV8. An internal voltage down converter VDC6 is disposed between power supply pads PDV5 and PDV6.

At the other side of semiconductor chip 1, ground pads PDG1, PDG2, PDG3 and PDG4 receiving a ground potential are arranged, opposed to power supply pad PDV5, PDV6, PDV7 and PDV8, respectively. An internal voltage down converter VDC7 is arranged at one end in the longer side direction of semiconductor chip 1, adjacent to power supply pad PDV7, and an internal voltage down converter VDC8 is arranged at the other end of semiconductor chip 1, adjacent to power supply pad PDV8. Internal voltage down converters VDC7 and VDC8 receive ground potentials supplied from pads PDG3 and PDG4, respectively. Each of ground pads PDG1 and PDG2 supplies a ground potential to internal voltage down converter VDC6.

In the configuration where pads are arranged along the outer periphery of semiconductor chip 1 as shown in FIG. 7, by arranging power supply pads at both ends of the chip, internal voltage down converters VDC7 and VDC 8 can also be arranged outside internal circuit forming region 30 (region for forming a memory cell array, its peripheral circuitry, and others) without any negative influence to the layout within internal circuit forming regions 30.

Furthermore, by disposing internal voltage down converter VDC6 between power supply pads PDV5 and PDV6, internal voltage down converter VDC6 can be arranged without any negative influence to arrangement of other pads (indicated by the dots).

The second embodiment of the present invention is described with reference to an internal voltage down converter. However, the present invention can be applied to any circuit which generates a predetermined internal potential from an external power supply potential, such as a circuit generating a negative voltage applied to the substrate or a circuit generating a high voltage for driving a word line.

As described above, according to the second embodiment, as an internal potential generating circuit is arranged adjacent to a power supply pad, the length of a power supply line for the internal potential generating circuit can be decreased, and increase of power supply line impedance and increase of interconnection area of the power supply line can be prevented. Furthermore, as a power supply pad is arranged at an end of the chip, an internal potential generating circuit can be disposed without any negative influence to the layout of the internal circuit, memory cell data and pad layout.

Third Embodiment

Figure 8A:
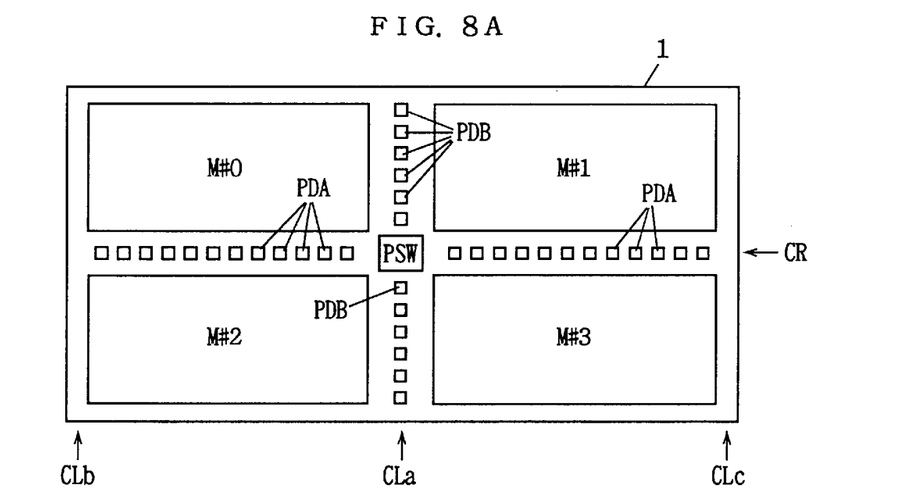
FIG. 8A schematically shows a planar layout of a semiconductor device according to a third embodiment of the present invention.

FIG. 8A schematically shows the layout of a semiconductor device according to a third embodiment of the present invention. In FIG. 8A, a plurality of pads PDA arranged in central region CR positioned at the central portion in the shorter side direction of semiconductor chip 1 include a data inputting/outputting pad, and an address signal inputting pad which is not used in the multibit test mode (i.e., upon compression). A plurality of pads PDB alignedly arranged along the shorter side direction in central region CLa positioned at the central portion in the longer side direction of semiconductor chip 1 include a pad receiving an externally supplied control signal which designates an operation mode of the semiconductor device. Pads PDB may include a pad which inputs an address signal used in the multibit test mode (referred to as a "non-compressed address signal" hereinafter). The non-compressed address signal inputting pad may be included in pads PDA arranged in central region CR. In the multibit test mode, memory cells of multiple bits are selected in each of memory cell arrays M#0–M#3 serving as internal circuits, and multiple memory cells simultaneously selected are tested simultaneously.

Therefore, in such a multibit test operation, it is not necessary to select a predetermined number of memory cells for inputting/outputting data from the memory cells of the multiple bits simultaneously selected in each of memory cell arrays M#0–M#3, and an address signal therefor is not required to be used. Further, in the multibit test mode, compressed data is input and output for each data inputting/outputting pad, though it is dependent on bit configuration of input/output data. In the case of such a multibit data, it is further compressed to one bit data so that only one data inputting/outputting pad is used. Thus, in central region CR, the number of pads used in the test mode of operation can be reduced.

Figure 8B:
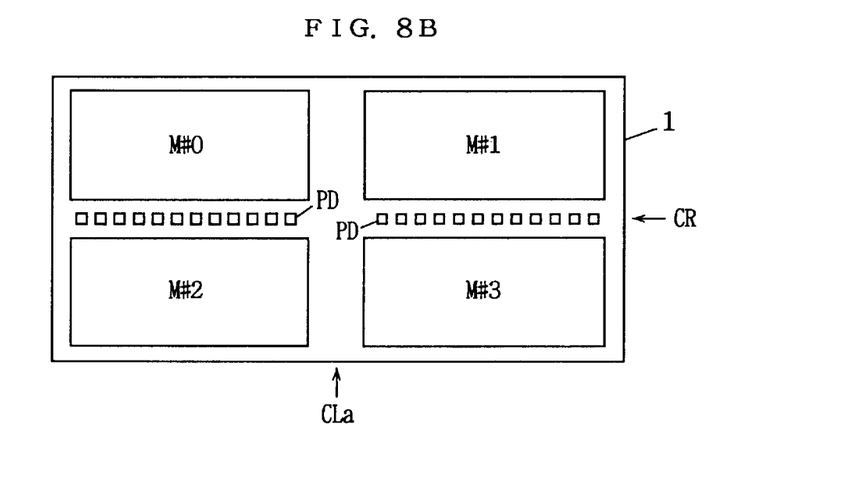
FIG. 8B shows an arrangement of pads used in the test operation.

A function of a pad PDB arranged in central region CLa is assigned to an unused pad in central region CR by using a pad switching circuit PSW. By pad switching function of pad switching circuit PSW, pads PD to be used are alignedly arranged along central region CR in a test mode of operation, as shown in FIG. 8B. With this arrangement in which pads are alignedly arranged along central region CR, an advantage of LOC structure, that is, a characteristic that probes of a test jig can be aligned at a predetermined pitch and the number of semiconductor chips can be simultaneously measured is sufficiently made use of, and a number of semiconductor chips having pads arranged in "a cross shape" where the pads are arranged in the longer and shorter directions can be tested simultaneously. This point will now be described.

Figure 9A:
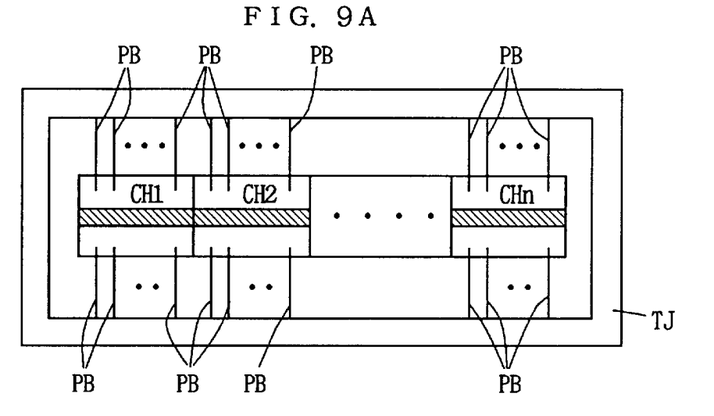
FIGS. 9A and 9B illustrate an effect of the third embodiment of the present invention.

In FIG. 9A, semiconductor chips CH1–CHn are alignedly arranged with respect to a test jig TJ. Each of semiconductor chips CH1–CHn has pads alignedly arranged in its central region (indicated by oblique lines). A probe PB from test jig TJ contacts each pad of semiconductor chips CH1–CHn. A pitch of probe PB can be set almost corresponding to pad pitch of semiconductor chips CH1–CHn. Therefore, semiconductor chips CH1–CHn can be arranged close to each other and semiconductor chips Chl-CHn can be tested simultaneously. This means that when a wafer is tested with semiconductor chips formed thereon, a number of semiconductor chips can be tested simultaneously.

Figure 9B:
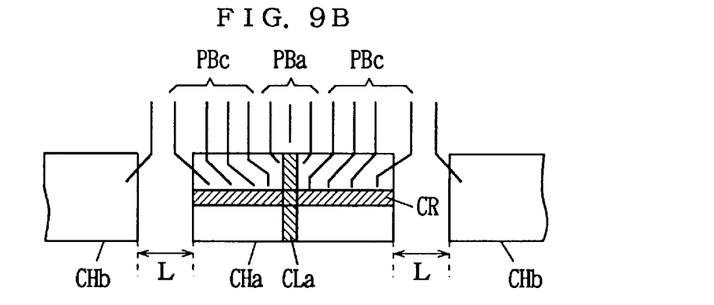

On the other hand, as shown in FIG. 9B, if a semiconductor chip CHa is provided with pads arranged in the cross shape, probes PBa for pads arranged in central region CLa are required to be arranged in the longer side direction of the semiconductor chip. As probes PBa for central region CLa exist, a region for arranging probes PBc for pads arranged in central region CR of semiconductor chip CHa is extended pad in the longer side direction of the chip. Accordingly, a region for arranging probe PBa and PBc for one semiconductor chip CHa is made longer than the length of the longer side of semiconductor chip CHa. This causes a space (the distance L) between semiconductor chip CHa and an adjacent semiconductor chip CHb, and accordingly the number of semiconductor chips simultaneously tested will undesirably decrease when a test jig TJ of the same size is used. In wafer test, semiconductor chips are alignedly arranged. In this case, as shown in FIG. 9B, in order to accommodate the equivalently increased semiconductor chip size, the number of semiconductor chips which can be simultaneously tested is reduced.

Therefore, as in the third embodiment, by reducing the number of pads arranged in central region CR of semiconductor chip CH and assigning or transferring functions of pads arranged in central region CLa to pads in the empty state in a test mode of operation, the number of pads can be equivalently reduced and a number of semiconductor chips can be simultaneously tested.

Figure 10:
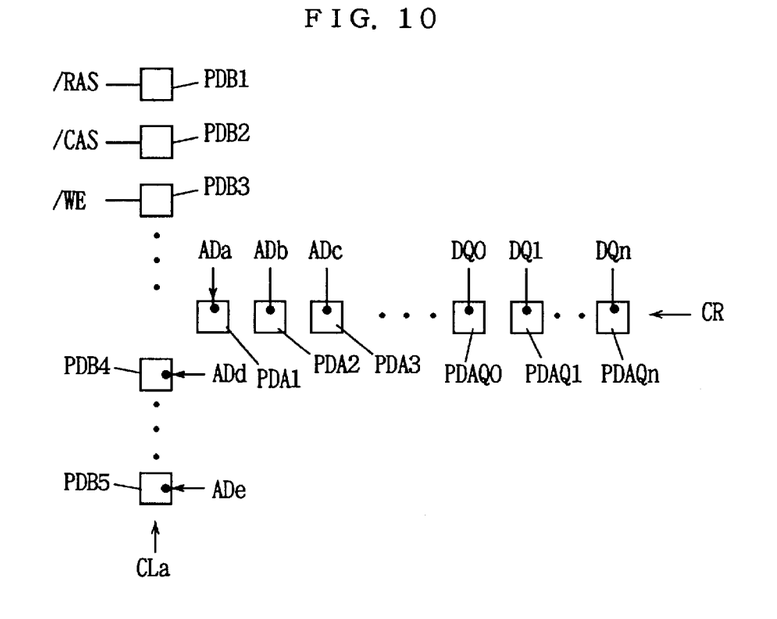
FIG. 10 shows a specific example of the pad arrangement of the third embodiment of the present invention.

FIG. 10 shows a specific example of pad arrangement. Arranged in central region CR in the longer side direction are address signal inputting pads PDA1, PDA2 and PDA3 receiving address signals ADa, ADb and ADc, and data inputting/outputting pads PDAQ0, PDAQ1, . . . , PDAQn for inputting/outputting data bits DQ0, DQ1, . . . , DQn. Any number of the inputting/outputting data bits can be used. Address signals ADa, ADb and ADc are degenerated (i.e., all are internally set to the selected state) in the test mode and are not used. Data input/output bits DQ0–DQn are compressed to one bit in the test mode of operation and test data is input/output via one of pads PDAQO-PDAQn.

Alignedly arranged in central region CLa in the shorter direction of the chip are pads PDB1, PDB2 and PDB3 which receive externally supplied input signals, that is, a row address strobe signal/RAS, a column address strobe signal/CAS and a write enable signal/WE, and address signal inputting pads PDB4-PDB5 which receive address signals ADd-ADe used in both a test mode and normal mode of operations. In the test mode of operation, pad PDB1–PDB5 alignedly arranged along region CLa have their functions assigned to pads PDA1–PDA3 and an unused pad of data input/output pads PDAQ0–PDAQn arranged in central region CR, respectively.

In the arrangement shown in FIG. 10, all of address signals ADa–ADe may be alignedly arranged in central region CR. In central region CR, the number of the pads to be used can be reduced in the test operation. That is, a pad unused in the test mode only need be disposed in central region CR so that a function of a pad arranged in CLa is assigned to the unused pad.

Figure 11:
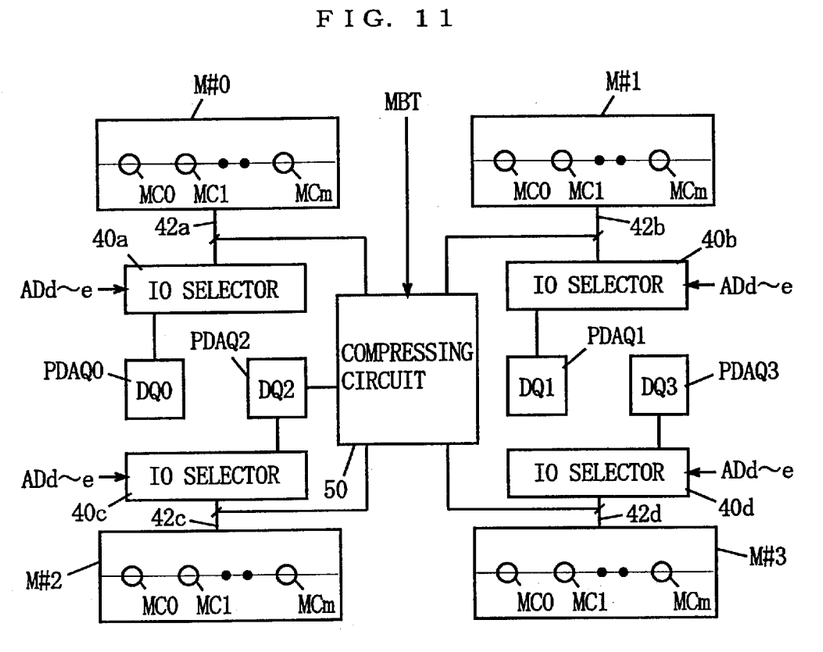
FIG. 11 schematically shows the configuration of the pad switching portion of the third embodiment of the present invention.

FIG. 11 schematically shows the configuration of a portion which compresses the data inputting/outputting pads to one pad in the test mode. In FIG. 8, the data input/output pad compressing portion is included in a block shown as pad switching circuit PSW. In FIG. 11, in each of memory cell arrays M#0–M#3 serving as an internal circuit, (m+1) memory cells MC0–MCm are simultaneously selected in both the normal mode and test mode and operation. Provided for memory cell arrays M#0–M#3 are IO selectors 40a–40d which select, according to address signal bits ADa-ADe (more accurately, according to their decoded signals), one memory cell from the (m+1) memory cells MC0–MCm simultaneously selected. In FIG. 11, IO selectors 40a–40d each select a memory cell of one bit for coupling with the corresponding data inputting/outputting pads PDAQ0–PDAQ3.

The number of memory cells selected by each of IO selectors 40a–40d is appropriately modified according to the number of data inputting/outputting bits of the semiconductor memory device. In FIG. 11, although IO selectors 40a–40d are shown being coupled with the corresponding data inputting/outputting pads PDAQO-PDAQ3, data inputting/outputting circuits are disposed between IO selectors 40a–40d and the corresponding data input/output pads PDAQ0–PDAQ3.

Compressing circuit 50 is provided for receiving and transmitting data from and to internal data inputting/outputting buses 42a–42d of memory cell arrays M#0–M#3. Compressing circuit 50 is coupled with data inputting/outputting pad PDAQ2, as an example. In the test mode of operation, compressing circuit 50 is responsive to activation of multibit test mode designating signal MBT to be put in the active state. When writing data in this mode, compressing circuit 50 transfers on internal data inputting/outputting buses 42a–42d a test data (DQ2) supplied to data inputting/outputting pad PDAQ2. Thus, the same data is written into memory cells MC0–MCn simultaneously selected in each of memory cell arrays M#0–M#3. When reading data, compressing circuit 50 compresses data (4(m+1) bit data) read on internal data inputting/outputting buses 42a–42d to one bit data (the result of coincidence/non-coincidence of logics is indicated by one bit) and outputs it to data inputting/outputting pad PDAQ2. Thus, pads PDAQ0–PDAQ3 are used in the normal mode of operation while only pad PDAQ2 is used in the test mode of operation, so that a function of another pad can be assigned to any of pads PDAQ0, PDAQ1 and PDAQ3.

Figure 12:
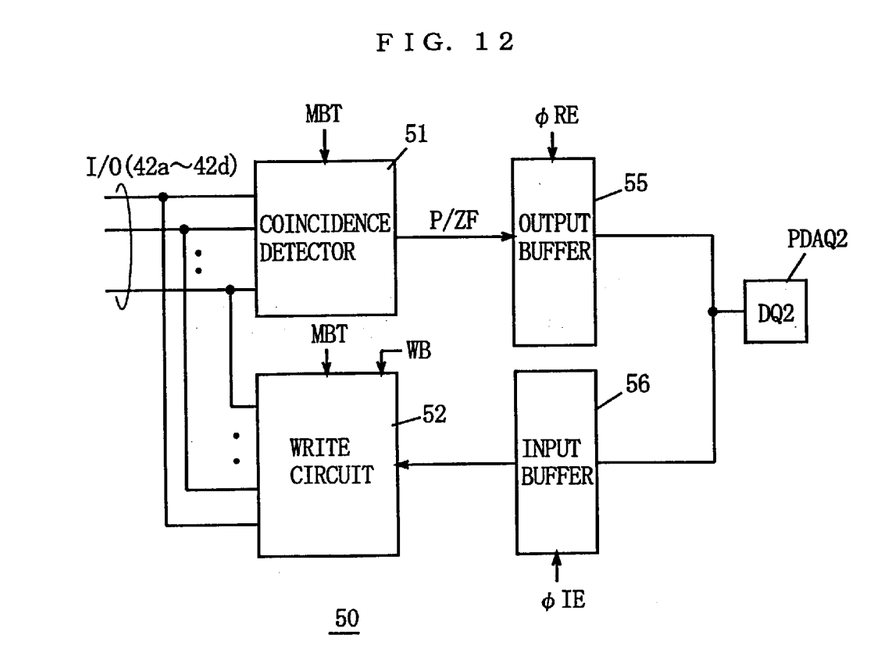
FIG. 12 schematically shows the configuration of the compressing circuit shown in FIG. 11.

FIG. 12 schematically shows the configuration of compressing circuit 50 shown in FIG. 11. In FIG. 12, compressing circuit 50 includes: a coincidence detector circuit 51 receiving internal read data on a data inputting/outputting bus I/O (any of buses 42a–42d), detecting coincidence/non-coincidence of logics of the internal read data and generating and supplying to an output buffer 55 a signal P/ZF indicating the detection result; and a write circuit 52 transmitting to internal inputting/outputting I/O a test data supplied from a input buffer 56 when writing the test data. Coincidence detector circuit 51 is activated by activation of multibit test mode designating signal MBT, and if all of logics of the internal read data supplied are coincident with each other, coincidence detector circuit 51 sets signal P/ZF to a state indicating pass and supplies it to output buffer 55. Write circuit 52 is enabled upon activation of multibit test mode designating signal MBT and is activated Iresponsive to an internal writing activating signal WB to transmit on internal data inputting/outputting bus I/O a write data supplied from input buffer 56. Output buffer 55 and input buffer 56 are coupled with pad PDAQ2 for inputting/outputting data. Although output buffer 55 and input buffer 56 are coupled with IO selector 40c, the connecting path to IO selector 40c is not shown in order to simplify the figure.

Furthermore, in the configuration of compressing circuit 50 shown in FIG. 12, coincidence detector circuit 51 may have a two-stage configuration consisting of the Ifirst stage of coincidence detector circuit provided for each of memory cell arrays M#0–M#3 and the subsequent stage of coincidence detector circuit receiving outputs of the first stage coincidence detector circuits. The subsequent stage coincidence detector circuit outputs signal P/ZF indicating pass/fail. Write circuit 52 may be configured such that it sets IO selectors 40a–40d to a selected state (a state in which all of memory cells MC0–MCm are selected) and transmit the test data to a inputting portion of each of IO selectors 40a–40d.

Output buffer 55 is activated responsive to a read/write instructing signal $_\phi RE$, and outputs to pad PDAQ2 signal P/ZF supplied from coincidence detector circuit 51 (in the test mode of operation). Input buffer 56 is activated responsive to a write instructing signal $_\phi IE$, and generates an internal write data from data DQ2 supplied to data inputting/outputting pad PDAQ2 for supply to write circuit 52 (in the test mode of operation).

Figure 13:
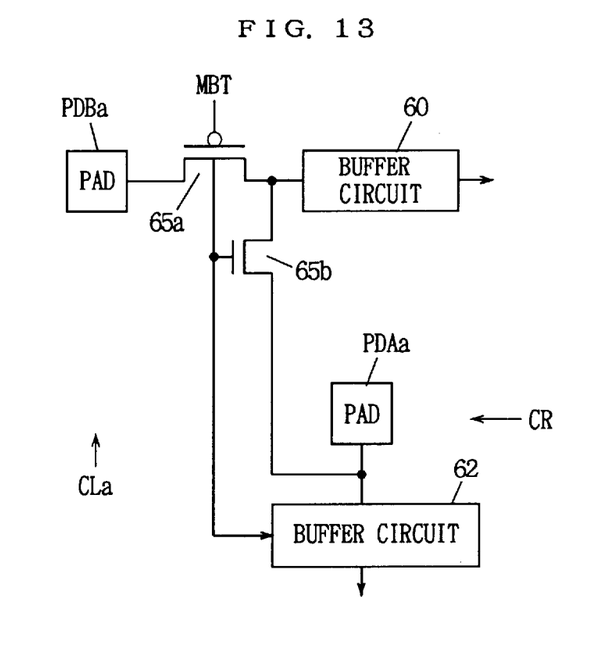
FIG. 13 schematically shows the configuration of the main portion of the pad switching circuit shown in FIG. 8A.

FIG. 13 shows a configuration for switching a pad function and representatively shows a configuration for assigning a function of pad PDBa to pad PDAa in the test mode of operation. Correspondence between pads provided in central region CLa and those arranged in central region CR is uniquely predetermined.

In FIG. 13, a buffer circuit 60 is provided for pad PDBa arranged in central region CLa, and a buffer circuit 60 is provided for pad PDAa provided in central region CR. Disposed between pad PDBa and buffer circuit 60 is a switching element 65a which is rendered non-conducting when multibit test mode designating signal MBT is activated, and arranged between pad PADa and buffer circuit 60 is a switching element 65b which is rendered conductive when multibit test mode designating signal MBT is activated. Buffer circuit 62 provided for pad PDAa is made non-conductive by signal MBT in the multibit test mode of operation.

In the multibit test mode, signal MBT is in the active state (the high level in FIG. 13), switching element 65a is non-conducting and switching element 65b is conducting. Accordingly, buffer circuit 60 is electrically disconnected from pad PDBa and is electrically connected to pad PDAa. Buffer circuit 62 is in the inactive state (or in a compressed state (when it is an address buffer)) by activation of signal MBT. In this state, a signal supplied from pad PDAa is supplied to buffer circuit 60 and buffer circuit 60 outputs the corresponding internal signal. Thus, in the test mode of operation, the function of pad PDBa is assigned to pad PDAa. In the normal mode of operation, signal MBT is in the inactive state (which is the low level in FIG. 13), switching element 65a is conducting and switching element 65b is non-conducting. In this state, pad PDBa is electrically connected to buffer circuit 60 and pad PDAa is electrically disconnected from buffer circuit 60. Buffer circuit 62 is activated (i.e. in the enable state) by the inactivation of signal MBT. Thus, the buffer circuits 60, 62 output internal signals according to signals supplied to pads PDBa, PDAa in the normal mode of operation, respectively.

Switching element 65a is provided to prevent connection of the both of pads PDAa and PDBa with an input portion of buffer circuit 60 resulting in increase of the input capacitance thereof in the test mode of operation. When the capacitance and noise of pad PDBa is not significant, switching element 65a is not particularly required. Furthermore, switching elements 65a and 65b only need have a function of switching the signal propagating paths and any configuration of CMOS transmission gate, logic gate or the like can be used therefor.

Modification

Figure 14:
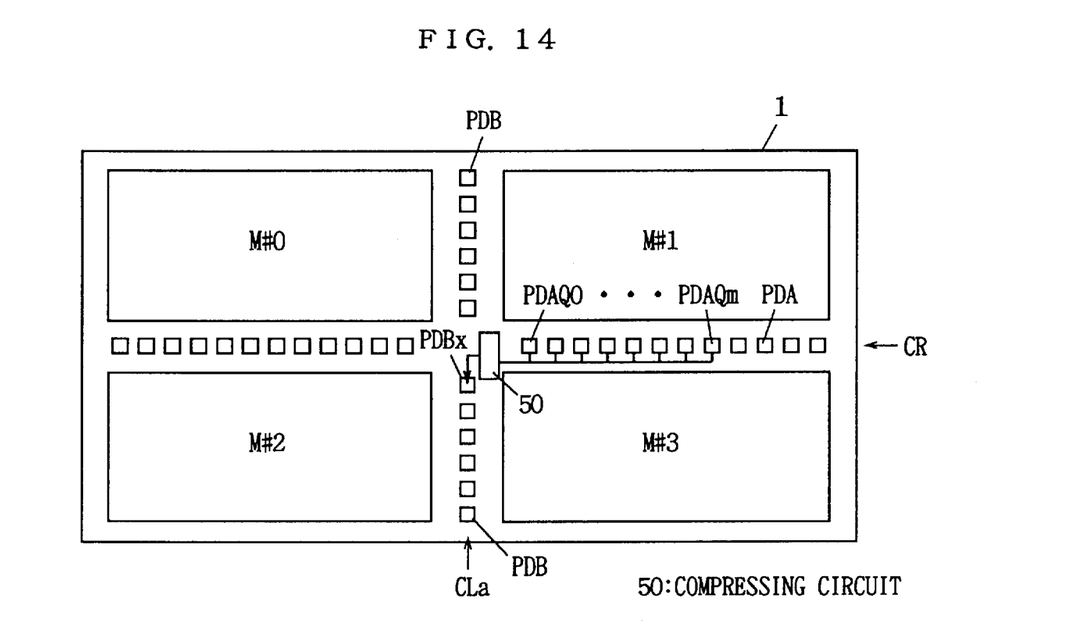
FIG. 14 schematically shows the structure of a modification of the third embodiment of the present invention.

FIG. 14 shows the configuration of a modification of the third embodiment. In FIG. 14, pads PDB are alignedly arranged in central region CLa positioned at the central portion with respect to the longer side direction of semiconductor chip 1, and pads PDA are alignedly arranged in the central region CR positioned in the central portion in the shorter side direction of semiconductor chip 1. As pad PDB arranged in central it region CLa, a pad receiving a signal which is not compressed in the test mode of operation is disposed. Pads PDA arranged in central region CR include data inputting/outputting pads PDAQ0–PDAQm (eight-bit data iinputting/outputting pads in FIG. 14). Compressing circuit 50 is provided that compresses data for data inputting/outputting pads PDAQ to one bit data.

Compressing circuit 50 is connected to a pad PDBX arranged in central region CLa. In the configuration shown in FIG. 14, data for data inputting/outputting pads PDAQ0–PDAQm is compressed by compressing circuit 50 and is transmitted to pad PDBX (in the data reading out operation). Thus, in the test mode of operation, signals are input/output using pads PDB and PDBx alignedly arranged in central region CLa while a test is performed. Pad PDBx may be an empty pad or an address signal input pad which is compressed in the test operation. In this configuration, functions of the data inputting/outputting pads only are switched, the number of pads the functions of which are switched can be reduced and the area occupied with the switching circuit portion can be reduced.

The configuration of compressing circuit 50 is the same as that shown in FIG. 11 except that compressing circuit shown in FIG. 11 is connected to pad PDBx in place of data inputting/outputting pad PDAQ2. In this example, compressing circuit 50 is configured to include output buffer 55 and input buffer 56 shown in FIG. 12.

In the third embodiment, pads PDB alignedly arranged in the shorter side direction are disposed in region CLa positioned at the central portion in the longer side direction. However, pads PDB may be arranged in regions CLb and CLc positioned at both ends in the longer side direction of semiconductor chip 1 (see FIG. 8).

Furthermore, pads compressed or unused in the test mode of operation may be alignedly arranged in central region CLa, while pads used both in the normal mode and the test mode of operations may be arranged in central region CR.

As mentioned above, according to the third embodiment, since pads used in both of the normal mode and the test mode of operations are arranged in one direction and pads compressed or unused in the test mode of operation are arranged in the other direction and since functions of pads are adapted to be switched such that pads to be used are aligned in one direction or the other direction in the test mode of operation, the number of pads used in the test mode of operation can be reduced so that the pads can be alignedly arranged in a line, and the number of devices (semiconductor chips) which can be simultaneously tested can be increased so that the time required for testing can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a plurality of power supply pads receiving externally applied power supply potentials of a common level; and
an internal voltage generating means disposed between power supply pads of said plurality of power supply pads and receiving the power supply potentials from said power supply pads for generating an internal voltage from the power supply potential received from the power supply pads.

2. The semiconductor device according to claim 1, wherein said plurality of power supply pads are alignedly arranged along a first direction of a semiconductor chip and at a central portion with respect to a second direction.orthogonal to said first direction.

3. The semiconductor device according to claim 1, wherein said internal voltage generating means comprises a voltage down converter for down-converting said power supply potentials to generate an internal power supply voltage as said internal voltage.

4. The semiconductor device according to claim 1; wherein said plurality of power supply pads are alignedly arranged in a first direction on a chip having said semiconductor device formed thereon, and wherein said semiconductor device further comprises another internal voltage generating means arranged on an end of said chip in the first direction and adjacent to a power supply pad of said plurality of power supply pads, for generating another internal voltage from the power supply potential received from the adjacent power supply pad.

5. A semiconductor device comprising:
a power supply pad arranged at an end portion with respect to a first direction of a semiconductor chip and receiving and internally supplying an externally supplied power supply potential; and
an internal voltage generating means arranged at said end portion of the first direction of said semiconductor chip and adjacent to said power supply pad for receiving the power supply potential from said power supply pad to generate an internal voltage.

6. The semiconductor device according to claim 5, wherein said power supply pad is arranged at a central portion of said semiconductor chip with respect to a second direction orthogonal to said first direction, and wherein said internal voltage generating means is arranged outside said power supply pad with respect to said first direction of said semiconductor chip.

7. The semiconductor device according to claim 5, wherein said internal voltage generating means is an internal voltage down converter converting the power supply potential to generate an internal power supply voltage as said internal voltage.

8. A semiconductor device comprising:
a conductive mounting member electrically isolated from an outside world of said semiconductor device;
a semiconductor substrate mounted on said mounting member with an insulative material interposed therebetween, and having a component formed on a surface thereof;
a predetermined potential generating portion formed on a surface of said semiconductor substrate and generating a predetermined potential; and
means for electrically connecting said predetermined potential generating portion with said conductive mounting member, wherein
said predetermined potential generating portion includes a member electrically connected to said semiconductor substrate to receive a potential of said semiconductor substrate.

9. The semiconductor device according to claim 8, further comprising a plurality of pads alignedly arranged on a surface of said semiconductor substrate along a first direction and at a central portion of said semiconductor substrate with respect to a second direction orthogonal to said first direction; wherein
said predetermined potential generating portion includes a pad arranged in an outer peripheral region of said semiconductor substrate and electrically connected to said mounting member.

10. The semiconductor device according to claim 9, wherein said pad of said predetermined potential generating portion is arranged at an outer end of a central portion of said semiconductor substrate with respect to said first direction.

11. A semiconductor device comprising:
a plurality of first pads alignedly arranged at a central region with respect to an X direction of a semiconductor substrate and along a Y direction orthogonal to said X direction, each of the first pads being assigned a predetermined function;
a plurality of second pads alignedly arranged in a central region with respect to said Y direction of said semiconductor substrate and along said X direction. each of the second pads being assigned a predetermined function; and
switching means responsive to an operation mode designating signal for electrically assigning a function of at least one predetermined pad of said plurality of first pads to a preselected pad of said plurality of second pads, wherein
said plurality of first pads include a plurality of pads for inputting/outputting data;
said semiconductor device further comprises means responsive to said operation mode designating signal for compressing and transferring to said predetermined pad output data to be transferred to said plurality of data inputting/outputting pads; and wherein
said switching means includes means responsive to said operation mode designating signal for transmitting an output signal of said compressing means to said preselected pad.

12. A semiconductor device comprising:
a plurality of first pads alignedly arranged at a central region with respect to an X direction of a semiconductor substrate and along a Y direction orthogonal to said X direction, each of the first pads being assigned a predetermined function;
a plurality of second pads alignedly arranged in a central region with respect to said Y direction of said semiconductor substrate and along said X direction, each of the second pads being assigned a predetermined function; and
switching means responsive to an operation mode designating signal for electrically assigning a function of at least one predetermined pad of said plurality of first pads to a preselected pad of said plurality of second pads, wherein said plurality of first pads include a plurality of data inputting/outputting pads; said semiconductor device further comprises compressing means responsive to said operation mode designating signal for receiving in parallel output data to be transmitted in parallel to said plurality of data inputting/outputting pads to detect coincidence or non-coincidence of logic levels of said output data and generate a signal indicating the result of detection for transmission to a pad different from said preselected pad; and wherein said switching means includes means responsive to said operation mode designating signal for transmitting a signal of the predetermined pad of said plurality of first pads to said preselected pad.

13. The semiconductor device according to claim 1, wherein said internal voltage generating means is adjacent to and sandwiched by said power supply pads of said plurality of power supply pads.

14. The semiconductor device according to claim 1, wherein any pad other than said power supply pads of said plurality of power supply pads is placed outside said power supply pads of said plurality of power supply pads.

15. A semiconductor device comprising:

a die pad;

a semiconductor substrate mounted on said die pad with an insulative material interposed therebetween, and having a component formed on a surface thereof;

a pad formed on said semiconductor substrate and receiving an internal voltage of a predetermined voltage level; and a bonding wire for connecting said pad to said die pad.

16. The semiconductor device according to claim 15, wherein said pad is connected to said semiconductor substrate to receive a voltage of said semiconductor substrate.

17. The semiconductor device according to claim 15, wherein said pad is arranged on an outer peripheral region of said semiconductor substrate.

18. The semiconductor device according to claim 15, wherein said semiconductor substrate has a plurality of other pads formed being alignedly arranged on a surface thereof along a first direction and at a central portion of said semiconductor substrate with respect to a second direction orthogonal to said first direction, and said pad is arranged at an outer end of a central portion of said semiconductor substrate with respect to said first direction.

19. A semiconductor device comprising:

a plurality of first pads alignedly arranged at a central region with respect to an X direction of a semiconductor substrate and along a Y direction orthogonal to said X direction, each of the first pads being assigned a predetermined function;

a plurality of second pads alignedly arranged in a central region with respect to said Y direction of said semiconductor substrate and along said X direction, each of the second pads being assigned a predetermined function; and switching means responsive to an operation mode designating signal for electrically assigning a function of at least one predetermined pad of said plurality of first pads to a preselected pad of said plurality of second pads, wherein said plurality of first pads include a plurality of output pads for outputting data; and wherein said switching means includes compressing means responsive to said operation mode designating signal or compressing and transferring to said preselected pad output data to be transferred in parallel to said plurality of data output pads.

* * * * *